(12) United States Patent
Singh et al.

(10) Patent No.: US 8,981,812 B2
(45) Date of Patent: Mar. 17, 2015

(54) SELF-READY FLASH NULL CONVENTION LOGIC

(71) Applicant: Wave Semiconductor, Inc., Sunnyvale, CA (US)

(72) Inventors: Gajendra Prasad Singh, Sunnyvale, CA (US); Richard Shaw Terrill, San Jose, CA (US)

(73) Assignee: Wave Semiconductor, Inc., Campbell, CA (US)

(*) Notice: Subject to any disclaimer, the term of this patent is extended or adjusted under 35 U.S.C. 154(b) by 187 days.

(21) Appl. No.: 13/827,902

(22) Filed: Mar. 14, 2013

(65) Prior Publication Data
US 2013/0214814 A1 Aug. 22, 2013

Related U.S. Application Data

(63) Continuation-in-part of application No. 13/772,759, filed on Feb. 21, 2013.

(60) Provisional application No. 61/610,559, filed on Mar. 14, 2012, provisional application No. 61/601,547, filed on Feb. 21, 2012.

(51) Int. Cl.
*H03K 19/094* (2006.01)

(52) U.S. Cl.
CPC ........ *H03K 19/094* (2013.01); *H03K 19/09425* (2013.01)
USPC .................................. 326/36; 326/39; 326/35

(58) Field of Classification Search
None
See application file for complete search history.

(56) References Cited

U.S. PATENT DOCUMENTS

| | | | |
|---|---|---|---|
| 5,305,463 A | 4/1994 | Fant et al. | |
| 5,355,496 A | 10/1994 | Fant et al. | |
| 5,572,732 A | 11/1996 | Fant et al. | |
| 5,640,105 A * | 6/1997 | Sobelman et al. | 326/36 |
| 5,652,902 A | 7/1997 | Fant | |
| 5,656,948 A * | 8/1997 | Sobelman et al. | 326/35 |
| 5,664,211 A | 9/1997 | Sobelman et al. | |
| 5,664,212 A | 9/1997 | Fant et al. | |
| 5,764,081 A | 6/1998 | Fant et al. | |
| 5,793,662 A | 8/1998 | Duncan et al. | |
| 5,796,962 A | 8/1998 | Fant et al. | |
| 5,805,461 A | 9/1998 | Fant et al. | |
| 5,828,228 A | 10/1998 | Fant et al. | |
| 5,896,541 A | 4/1999 | Fant et al. | |
| 5,907,693 A | 5/1999 | Fant et al. | |
| 5,930,522 A | 7/1999 | Fant | |
| 5,977,663 A | 11/1999 | Fant et al. | |
| 5,986,466 A * | 11/1999 | Sobelman et al. | 326/39 |
| 6,020,754 A * | 2/2000 | Sobelman et al. | 326/35 |
| 6,031,390 A * | 2/2000 | Fant et al. | 326/36 |

(Continued)

OTHER PUBLICATIONS

"Glitch-Free Design for Multi-Threshold CMOS NCL Circuits", by Al Zahrani, et al., GLIVLSI'09, May 10-12, 2009, Boston, Massachusetts, Copyright 2009 ACM 978-1-60558-522-2/09/05.

*Primary Examiner* — Crystal L Hammond
(74) *Attorney, Agent, or Firm* — Adams Intellex, PLC

(57) ABSTRACT

A self-ready flash null Convention Logic (NCL) gate includes a one-shot circuit to create the flash timing to reset the gate to a null state. The one-shot circuit may be any type of circuit to generate a pulse in response to a change of state of an input line. In one embodiment, the one-shot circuit may start the pulse in response to a change of a flash input line and end the pulse in response to the NCL output being reset to a null state.

20 Claims, 10 Drawing Sheets

(56) References Cited

U.S. PATENT DOCUMENTS

| | | | |
|---|---|---|---|
| 6,043,674 A * | 3/2000 | Sobelman | 326/35 |
| 6,052,770 A | 4/2000 | Fant | |
| 6,128,678 A | 10/2000 | Masteller | |
| 6,262,593 B1 | 7/2001 | Sobelman et al. | |
| 6,275,841 B1 | 8/2001 | Potter et al. | |
| 6,308,229 B1 | 10/2001 | Masteller | |
| 6,313,660 B1 | 11/2001 | Sobelman et al. | |
| 6,327,607 B1 | 12/2001 | Fant | |
| 6,333,640 B1 | 12/2001 | Fant et al. | |
| 6,433,584 B1 * | 8/2002 | Hatae | 326/80 |
| 6,526,542 B2 | 2/2003 | Kondratyev | |
| 6,900,658 B1 | 5/2005 | Sobelman et al. | |
| 7,053,662 B1 | 5/2006 | Silver et al. | |
| 7,478,222 B2 | 1/2009 | Fant | |
| 7,930,517 B2 | 4/2011 | Fant | |
| 7,977,972 B2 | 7/2011 | Di et al. | |
| 8,020,145 B2 | 9/2011 | Fant | |
| 8,026,741 B2 | 9/2011 | Takayanagi | |
| 8,078,839 B2 | 12/2011 | Fant | |
| 8,086,975 B2 | 12/2011 | Shiring et al. | |
| 2006/0233006 A1 | 10/2006 | Fant | |
| 2009/0204788 A1 | 8/2009 | Fant | |

* cited by examiner

SELF-READY FLASH NULL CONVENTION LOGIC

RELATED APPLICATIONS

This application claims the benefit of U.S. provisional patent application "Self-Ready Flash Null Convention Logic" Ser. No. 61/610,559, filed Mar. 14, 2012. This application is also a continuation-in-part of U.S. patent application "Multi-Threshold Flash NCL Circuitry" Ser. No. 13/772,759, filed Feb. 21, 2013 which claims the benefit of U.S. provisional patent application "Multi-Threshold Flash NCL Circuitry" Ser. No. 61/601,547, filed Feb. 21, 2012. The foregoing applications are hereby incorporated by reference in their entirety.

FIELD OF ART

This application relates generally to logic circuitry and more particularly to flash null convention logic with self readying circuitry.

BACKGROUND

Advances in integrated circuit manufacturing technologies make possible electronic systems comprising tens or even hundreds of millions of active devices. In addition, increased numbers of interconnection layers provide for more signal wiring and more complex control schemes. Among other things, the demand for such systems has led to increased system performance, decreased device size, and greater feature sets. The direct result of system and technology improvements is ever increasing design complexity. The design complexity drives engineering challenges with regard to circuit design, system implementation and control, chip fabrication, and the like. This complexity has for example, driven greater scrutiny of the logic circuits, interconnection schemes, systems architectures, and controls. As a result, new technologies, architectures, and circuit families have been developed which can take advantage of reduced total device count, smaller device sizes, and simplified wiring/control schemes. These circuit families each provide certain benefits and costs, each requiring its own careful design considerations.

Logic circuits fall into two broad categories, static circuits and dynamic circuits. Static circuits find many applications where signal integrity and system robustness are paramount design criteria. In contrast, dynamic circuits find many applications where system performance and circuit density are paramount. Personal computer memories and microprocessors are typical examples of circuits that demand high circuit density with high system performance. Interest has been focused on circuit families that can drastically reduce the amount of clock and control signal interconnect required to support them. For example, circuit families that do not require a clock signal, such as asynchronous or self-timed circuits, have distinct advantages over their clocked counterparts because the need for external control signals is reduced or eliminated. Further, circuit families that can provide for the local generation of required control signals may further reduce wiring and control complexity.

SUMMARY

Self-ready flash null convention logic (NCL) includes a one-shot circuit as a part of the reset to null circuitry of the gate. Depending on the embodiment, the one-shot may be simple combinatorial logic, an asynchronous state machine, a mono-stable multivibrator, or any other circuit to generate a pulse from a transition on an input line. The one-shot may also include an input to terminate the pulse that may be driven by the output of the NCL circuit. A logic circuit is disclosed comprising: a gate comprised of a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and a one-shot circuit wherein the flash input line is an input to the one-shot circuit and wherein the one-shot circuit is used to reset the gate and set the output line into the null output state.

The plurality of transistors that provide for logical evaluation may pull down a node within the gate and cause the output line to transition to the asserted output state. The logic circuit may further comprise a storage element that retains one of the asserted output state and the null output state on the output line. The logic circuit may further comprise a gated inverter that is part of the storage element for the gate. The gated inverter may be gated in part based on the flash input line. The gated inverter may be gated in part based on the plurality of input lines. The one-shot circuit may include a mono-stable multi-vibrator pulse generator. The logic circuit may further comprise a pulse termination circuit connected to the one-shot circuit. The pulse termination circuit may have the output line, of the gate, as an input to the pulse termination circuit. The pulse termination circuit may have, as an input, a node within the gate derived from a logical evaluation node. The gate may comprise an m-of-n threshold gate. The gate may form a null convention circuit. The gate may comprise a flash type circuit. The logic circuit may further comprise a transistor in a pull-up path coupled to a path for the logical evaluation. The transistor in the pull-up path may be part of circuitry used to reset the gate. The transistor in the pull-up path may be a high-threshold transistor. The transistor in the pull-up path may limit current leakage for the gate when the transistor in the pull-up path is in an off state. The transistor in the pull-up path may be activated based on a subset of signals that are coupled to the plurality of transistors that provide for logical evaluation and the subset of signals activate the transistor in the pull-up path without enabling the logical evaluation. The logic circuit may further comprise a transistor in a pull-down path coupled to a path for the logical evaluation. The transistor in the pull-down path may be a high-threshold transistor. The transistor in the pull-down path may turn off the pull-down path when the gate is being reset. The transistor in the pull-down path may limit current leakage for the gate when the transistor in the pull-down path is in an off state. The transistor in the pull-down path may be activated based on a subset of signals that are coupled to the plurality of transistors that provide for logical evaluation and the subset of signals activate the transistor in the pull-down path without enabling the logical evaluation. The logic output line may drive an input of one of an NCL gate, a Flash NCL gate, and a Self-Ready Flash NCL gate.

In embodiments, a computer implemented method for using logical evaluation may comprise: forming a logic gate from of a plurality of transistors wherein the plurality of transistors provide for logical evaluation; including a plurality of input lines, each having an asserted state and a null state, connected to the logic gate; providing a flash input line, having a first state and a second state, connected to the logic gate; observing an output line, having an asserted output state and a null output state, connected to the logic gate; and including a one-shot circuit wherein the flash input line is an input to the one-shot circuit and wherein the one-shot circuit is used to reset the logic gate and set the output line into the null output state. In some embodiments, an m-of-n flash-type threshold gate may comprise: a plurality of transistors wherein the plurality of transistors provide for logical evaluation; a plurality of n input lines, each having an asserted state and a null state, connected to the gate; a flash input line, having a first state and a second state, connected to the gate; an output line, having an asserted output state and a null output state, connected to the gate wherein the output line transitions to the asserted output state when m of the n input lines are in their respective asserted states; and a one-shot circuit wherein the flash input line is an input to the one-shot circuit and wherein the one-shot circuit is used to reset the gate and set the output line into the null output state. In embodiments, a computer implemented method for using logic implementation may comprise: including a self-ready flash null convention logic gate wherein the self-ready flash null convention logic gate comprises: a plurality of transistors wherein the plurality of transistors provide for logical evaluation; a plurality of input lines, each having an asserted state and a null state, connected to the logic gate; a flash input line, having a first state and a second state, connected to the logic gate; an output line, having an asserted output state and a null output state, connected to the logic gate; and a one-shot circuit wherein the flash input line is an input to the one-shot circuit and wherein the one-shot circuit is used to reset the logic gate and set the output line into the null output state; connecting the self-ready flash null convention logic gate to preceding and following logic; and connecting the flash input line to a flash null generation circuit.

In some embodiments, a computer program product embodied in a non-transitory computer readable medium for logic implementation may comprise: code for including a self-ready flash null convention logic gate wherein the self-ready flash null convention logic gate comprises: a plurality of transistors wherein the plurality of transistors provide for logical evaluation; a plurality of input lines, each having an asserted state and a null state, connected to the logic gate; a flash input line, having a first state and a second state, connected to the logic gate; an output line, having an asserted output state and a null output state, connected to the logic gate; and a one-shot circuit wherein the flash input line is an input to the one-shot circuit and wherein the one-shot circuit is used to reset the logic gate and set the output line into the null output state; code for connecting the self-ready flash null convention logic gate to preceding and following logic; and code for connecting the flash input line to a flash null generation circuit. In embodiments, a computer system for logic implementation may comprise: a memory which stores instructions; one or more processors coupled to the memory wherein the one or more processors are configured to: include a self-ready flash null convention logic gate wherein the self-ready flash null convention logic gate comprises: a plurality of transistors wherein the plurality of transistors provide for logical evaluation; a plurality of input lines, each having an asserted state and a null state, connected to the logic gate; a flash input line, having a first state and a second state, connected to the logic gate; an output line, having an asserted output state and a null output state, connected to the logic gate; and a one-shot circuit wherein the flash input line is an input to the one-shot circuit and wherein the one-shot circuit is used to reset the logic gate and set the output line into the null output state; connect the self-ready flash null convention logic gate to preceding and following logic; and connect the flash input line to a flash null generation circuit.

Various features, aspects, and advantages of various embodiments will become more apparent from the following further description.

BRIEF DESCRIPTION OF THE DRAWINGS

The following detailed description of certain embodiments may be understood by reference to the following wherein.

DETAILED DESCRIPTION

Figure 1:
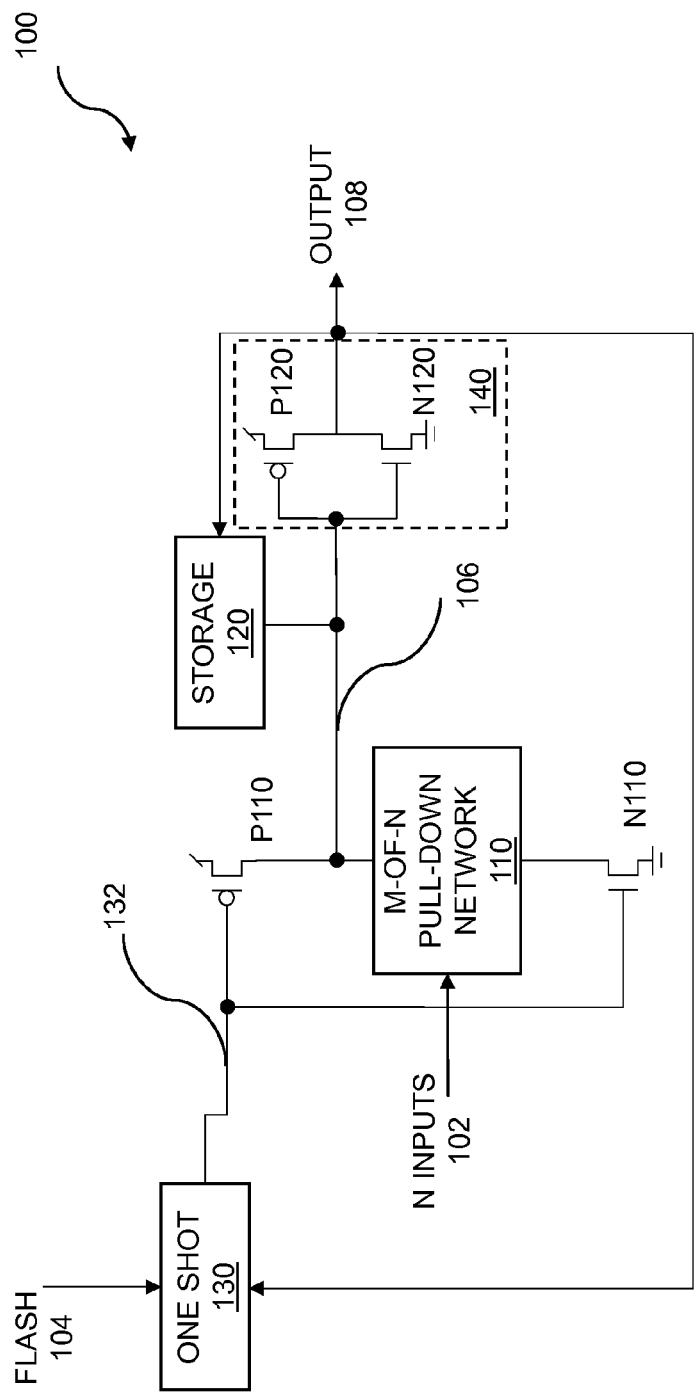
FIG. 1 is a circuit diagram of a flash NCL gate including a one shot.

The present disclosure provides a description of self-ready (SR) flash null convention logic (NCL) circuits. Flash NCL circuits are different from standard NCL circuits in that they provide for a direct mechanism for resetting the circuits instead of waiting for nulls to propagate through stages of circuits. But in practice, generation of a flash signal may present many challenges. While flash NCL gates provide for a faster data-null cycle, generation of a correct and in time flash signal may be difficult to do properly within stringent delay specifications. The delay in flash signal generation may cause a delay in the "Go to Data" cycle for a flash NCL logic gate. By including a one-shot circuit with the NCL gate to generate the timing signals for resetting the circuit, these delays may be eliminated, providing for higher performance NCL circuitry.

Flash NCL circuits are a class of asynchronous circuits described in U.S. Pat. No. 6,043,674 entitled "Null Convention Logic Gates with Flash, Set and Reset Capability," which is incorporated herein by reference in its entirety. Flash NCL may use logic gates referred to as threshold gates with varying numbers of inputs and threshold values where a threshold value is defined as a number of inputs being in an "on" state simultaneously. An important aspect of NCL circuits is that any particular input line may have a meaningful (i.e. logic) value or a null value. In many embodiments, NCL logic includes two physical lines to provide a single signal and these embodiments are often referred to as dual-rail NCL. In such a dual-rail NCL technology, there are four possible states, a logical one value, a logical zero value, a null value, and an illegal value. The presence of a non-null value, i.e. a logical one value or a logical zero value, indicates that the state has meaning. The illegal value should never occur within NCL circuitry. No external clock is required to indicate that valid (i.e. logic) evaluation is possible.

Null convention logic circuitry has numerous implementations. Null convention logic circuitry may generate "asserted states", for example "one" and "zero", and a null state. In one implementation, two physical lines may be used to convey an input line's state. For example, a "zero" or logic "false" may be determined by a low voltage being present on the first physical line and a high voltage being present on the second physical line. A "one" or logic "true" may be determined by a high voltage being present on the first physical line and a low voltage being present on the second physical line. A null state may be determined by low voltage levels being present on both physical lines. A high voltage level being present on both physical lines would be considered undefined and would not be used. Other embodiments of NCL logic may utilize multiple different voltages on a single line to indicate null and asserted states. For example, such a system may use ground to indicate a null state, a "high" or positive voltage for a true state, and a "low" or negative voltage for a false state.

Self-ready flash NCL logic gates include circuitry which provides a pulse to a reset line to put the self-ready flash NCL logic gates into a null state. The circuitry used to generate the pulse may include a one-shot circuit. The one-shot circuit may be triggered by a flash line or a line derived from the flash line. The reset pulse may be terminated by detecting that the output of a gate has been transitioned into a null state. In order to accomplish such a detection, the output of the gate may be fed as an input to the one-shot circuit.

The self-ready flash NCL may be implemented in CMOS logic using FET transistors. Field-effect transistors (FETs) are described as "on" in the linear and saturated regions of operation and may conduct current. During the "off" state for the FET, the gate input voltage is below a threshold voltage (Vt) for the transistor. A transistor exhibits current consumption even when "off". This consumption is characterized as sub-threshold leakage current. The gate input voltage is below a threshold voltage for the transistor in this state. Normally an N-type metal-oxide semiconductor (NMOS) field-effect transistor, also referred to as an NFET, is in the off state when its gate is at zero volts (ground) and while the source of the NFET is also at ground. Normally a P-type metal-oxide semiconductor (PMOS) field-effect transistor, also referred to as a PFET, is in the off state when its gate is at the supply voltage (Vdd) and while the source of the PFET is also at Vdd. In some embodiments, high-Vt devices may be included in the self-ready flash NCL circuitry. In some cases this circuitry could be considered multi-threshold flash null convention logic (NCL). Such logic includes one or more high threshold voltage transistors (High Vt) within the NCL gate to reduce power consumption due to current leakage in the lower voltage threshold transistors of the NCL gate. Because the NCL gate may be built using high-speed transistors, the leakage current of the transistors may be significant, even when the circuit is quiescent (i.e. not switching). By including at least one high-Vt device having low leakage current in the current path, the leakage current of the NCL gate may be significantly reduced, thereby reducing the power consumption of the NCL gate. In some embodiments, the high-Vt transistors (also known as devices) may be added to the basic NCL gate structure, and/or high-Vt transistors may be used in place of one or more lower voltage threshold transistors of the basic NCL gate structure in various embodiments. Under certain conditions the FET exhibits sub-threshold leakage. By using a higher-threshold FET device, current in the sub-threshold voltage regime is radically reduced.

FIG. 1 is a circuit diagram of a flash NCL gate 100 including a one shot 130. The gate 100 is a logic circuit that includes a plurality of transistors to provide for logical evaluation, such as the logical evaluation of a threshold gate, as shown later. The gate 100 forms a null convention circuit and may be referred to as a flash type circuit. An m-of-n threshold gate asserts an output line 108 if a predetermined number "m" of the "n" input lines 102 are asserted. In the embodiment shown, the logical evaluation is performed by the m-of-n pull-down network 110 so that the gate is an m-of-n threshold gate. Thus, the gate 100 has a plurality of input lines 102, each with an asserted state and a null state, connected to the gate 100, and an output line 108, with an asserted output state and a null output state, connected to the gate.

The gate 100 includes a flash input line 104, having a first state and a second state, connected to the gate 100. The gate 100 also includes a one-shot circuit 130 used to reset the gate 100 and set the output line 108 into the null output state. The flash input line 104 is an input to the one-shot circuit. The one-shot circuit 130 may generate a pulse in response to a transition of the flash input line 104 from the first state to the second state and may terminate the pulse in response to the output 108 going to null. A one-shot circuit, for the purposes of this disclosure, may be any type of circuit that generates a pulse in response to a state transition of an input line and which may or may not have a second input to terminate the pulse, depending on the embodiment. Various embodiments of a one-shot circuit may include, but are not limited to, combinatorial logic such as a NAND gate having inputs of the flash input line 104 and the output line 108, a NAND gate having inputs of the flash input line 104 and a delayed version of the flash input line 104 created by a string of buffers or inverters, an asynchronous state machine using the flash input line 104 and the output line 108 as inputs, a mono-stable multivibrator triggered by the flash input line 104, or any other type of circuit having the flash input line 104 as an input.

In the gate 100, the one-shot 130 initiates a low voltage level pulse on the reset node 132 in response to the flash input line 104 transitioning. The transition of the flash input line 104 may be from low to high or from high to low, depending on the embodiment, but may be assumed to be the transition from low to high in this embodiment. A low voltage level on the reset node 132 turns on the p-channel field effect transistor (PFET) P110 and turns off the n-channel field effect transistor (NFET) N110, which pulls logical evaluation node 106 high. Logical evaluation node 106 is fed into the output inverter 140 which is built from PFET P120 and NFET N120, so the output line 108 goes low, or to null.

Once the output line 108 is driven low, the one-shot 130 may terminate its output pulse by driving the reset node 132 high in some embodiments. A high level on the reset node 132 turns PFET P110 off and NFET N110 on, allowing the m-of-n pull-down network 110 to perform its logical evaluation function as the plurality of transistors that provide for logical evaluation are part of the pull-down path. As long as fewer than "m" of the "n" inputs 102 are asserted, the network 110 is in a high-impedance state. Thus, the logical evaluation node 106 remains high and the output line 108 is low, or null. Noting that NFET N110 is on, once at least "m" of the "n" inputs 102 are asserted, then the network 110 may turn on, pulling logical evaluation node 106 low, causing the output inverter 140 to assert, or drive high, the output line 108.

In some embodiments, storage 120 provides feedback from the output 108 to logical evaluation node 106. Storage 120 may be an inverter in some embodiments, while in other embodiments it may simply be a PFET transistor to pull high the logic evaluation node 106. In some embodiments, the transistors used in storage 120 may be smaller, with limited current capability and/or have a higher on-state resistance in comparison to the transistors used in other parts of the gate 100. Once the gate 100 has been reset and the output line 108 is low, storage 120 may help keep the logical evaluation node 106 high until it is pulled low by the m-of-n pull-down network 110. Storage 120 may also provide a latching effect in the case of changing input 102 values. In this example, at least "m" of the "n" inputs 102 are asserted for some period of time, causing the output line 108 to be asserted. Then if one or more of the inputs goes back to the null state, putting the m-of-n pull-down network 110 back into a high impedance state, the storage 120 maintains the logical evaluation node 106 at a low until the one-shot 130 resets the gate 100 again. So the gate 100 may include a storage element 120 that retains one of the asserted output state and the null output state on the output line 108. In embodiments, certain transistors may be included or excluded from circuit 100. In some embodiments, the gate 100 may have a corresponding other gate for handling information of the opposing rail from a dual rail implementation. The N inputs 102 would have a correlating N inputs and the output 108 would have a correlating output. So the valid states for the output 108 and the correlating output would be "00", "01", and "10" to represent null, zero, and one states respectively. Throughout this disclosure, when a single rail implementation is shown, a dual rail implementation should be understood to apply as well. In some embodiments, a one shot 130 circuit could be shared by both gates from a dual rail implementation. Additionally, it should be understood that a one shot 130 circuit could be shared among other neighboring self-ready flash NCL gates.

Figure 2:
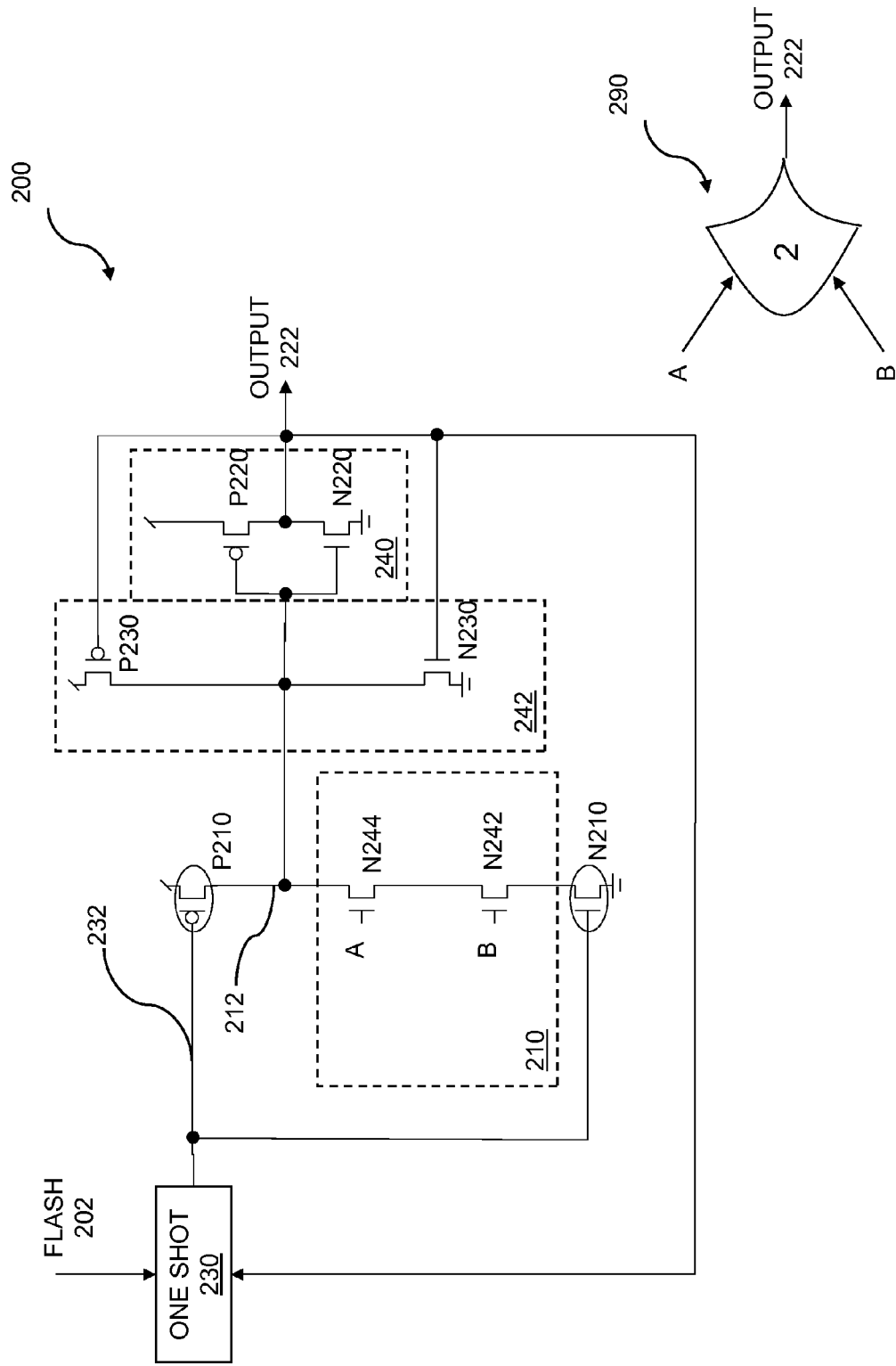
FIG. 2 is an example 2-of-2 flash NCL circuit with one shot.

FIG. 2 is an example 2-of-2 flash NCL circuit 200 with one shot 230. An alternative schematic representation of the circuit 200 is the gate symbol 290 having two inputs, "A", and "B", with the numeral "2" inside the gate symbol, and a single output 222. The circuit 200 includes high voltage threshold field-effect transistors (high-threshold transistors). It should be noted that there are varying ways of drawing schematic symbols for transistors throughout the industry. In the of this disclosure, an NFET with a low or standard voltage threshold is shown with the drain connected to the source by a solid line with a separate line used for the gate having no surrounding oval, such as NFET N220. A PFET with a low or standard voltage threshold is shown with the drain connected to the source by a solid line with small circle on a separate line used for the gate having no surrounding oval, such as PFET P220. Transistors having a high threshold voltage or low leakage current are shown with a surrounding oval, so an NFET with a high voltage threshold and low leakage current is shown with the drain connected to the source by a solid line with a separate line used for the gate inside a surrounding oval, such as high Vt N210. A PFET with a high voltage threshold and low leakage current is shown with the drain connected to the source by a solid line with small circle on a separate line used for the gate inside a surrounding oval, such as high Vt P210.

It should be noted that there are varying ways of drawing schematic symbols for transistors throughout the industry. The actual threshold voltages and leakage currents of the high-Vt transistors and standard transistors may vary dramatically depending on the technology used, with the voltage threshold of a standard transistor ranging from several volts for some technologies to only millivolts (mV) in other technologies. The different parameters to change voltage threshold and/or leakage current for a transistor are well-known in the art but may include thicker gate oxides, a different channel dopant density, different channel and/or gate geometry, or other differences in the ways that the transistors are fabricated. For the purposes of this disclosure, the terms low leakage transistor, high voltage threshold transistor, high-Vt transistor, and high threshold transistor may be thought of as synonyms and may be used interchangeably.

The circuit 200 is similar to the gate 100 of FIG. 1. In circuit 200, the logical evaluation is performed by the 2-of-2 pull-down network 210 that includes NFET N244 and NFET N242 in series with input A driving the gate of NFET N244 and input B driving the gate of NFET 242. The circuit 200 includes a flash input line 202 coupled to a one-shot circuit 230 that may be used to reset the circuit 200 and set the output line 222 into the null output state. In the circuit 200, the one-shot 230 initiates a low voltage level pulse on the reset node 232 in response to the flash input line 202 transitioning. A low voltage level on the reset node 232 turns on the high-threshold transistor P210 and turns off the high-threshold transistor N210, which pulls logical evaluation node 212 high. Logical evaluation node 212 is fed into the output inverter 240 which is built from PFET P220 and NFET N220, so the output line 222 goes low, or to null.

Once the output line 222 is driven low, the one-shot 230 may terminate its output pulse by driving the reset node 232 high in some embodiments. A high level on the reset node 232 turns high-threshold transistor P210 off and high-threshold transistor N210 on, allowing the 2-of-2 pull-down network 210 to perform its logical evaluation function. As long as at least one of the A input and the B input is null, the network 210 is in a high-impedance state so that logical evaluation node 212 remains high and the output line 222 is low, or null. Because NFET N210 is on, once both A and B are asserted, logical evaluation node 212 is pulled low, causing output inverter 240 to assert, or drive high, the output line 222. The inverter 242 built from PFET P230 and NFET N230 acts as storage to provide feedback from the output 222 to logical evaluation node 212.

The circuit 200 includes a high-threshold transistor P210 in a pull-up path which is part of circuitry used to reset the gate of the circuit 200. The high-threshold transistor P210 may help reduce power consumption because the high-threshold transistor P210 in the pull-up path limits current leakage for the gate when in the off state. The circuit 200 may also include a high-threshold transistor N210 in a pull-down path in some embodiments. High-threshold transistor N210 turns off the pull-down path when the gate is being reset. Various embodiments may include high-threshold transistor P210 without high-threshold transistor N210, high-threshold transistor N210 without high-threshold transistor P210, or both high-threshold transistor P210 and high-threshold transistor N210. Other embodiments may include one, two, three, four or more high-threshold transistors in an NCL gate that may or may not include high-threshold transistor P210 and/or high-threshold transistor N210. The high-threshold transistors may replace standard voltage threshold transistors of the circuit 200, such as NFET N220, NFET N230, or PFET P230 or may be added to the existing FETs, such as adding a high-threshold transistor in the pull-up path of PFET P220. But many self-ready flash NCL circuits may contain no high-threshold transistors.

Figure 3:
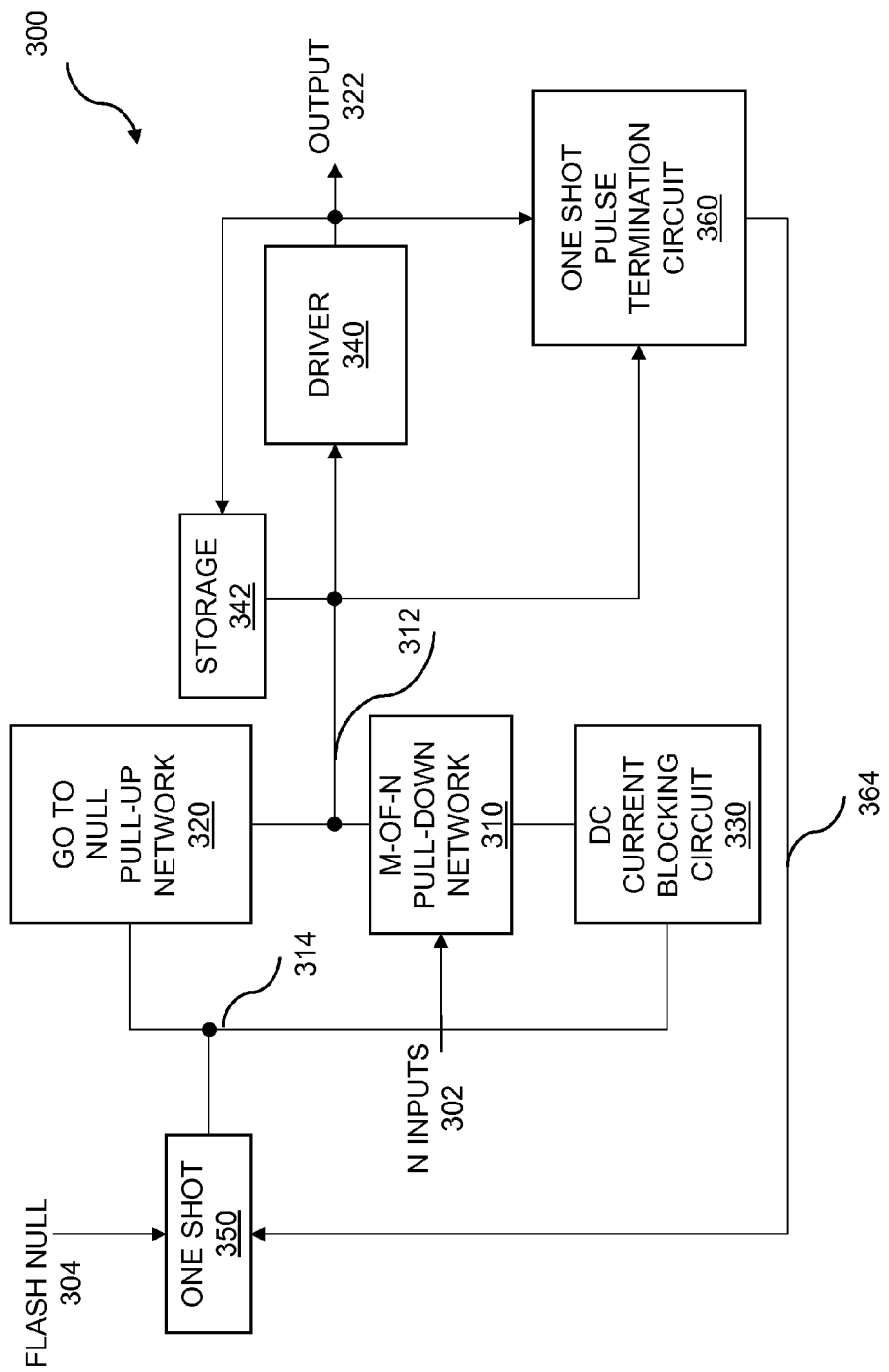
FIG. 3 is a block diagram of a self-ready flash NCL gate.

FIG. 3 is a block diagram of a self-ready flash NCL gate 300. The block diagram of FIG. 3 presents a conceptual view of an example self-ready flash NCL gate. Many of the elements shown in FIG. 3 may be included in various embodiments of self-ready flash NCL gates but some embodiments may not include all the elements shown and other embodiments may include additional features or circuits beyond those represented in FIG. 3. The circuit 300 may have "n" inputs 302 coupled to an m-of-n pull-down network 310. The m-of-n pull-down network 310 may be coupled between a "go to null pull-up network" 320 and a "DC current blocking circuit" 330. Logical evaluation node 312, may be located between the "m-of-n pull-down network" 310 and the "go to null pull-up network" 320, and is also coupled to a driver 340 that may drive the output line 322. Storage 342 may feed-back the state of the output line 322 to the logical evaluation node 312 to provide stability and/or hysteresis in some embodiments.

A one-shot circuit 350 may have a flash null input 304 as an input and a reset node 314 as an output. Various embodiments may use various circuits for the one-shot as described above, but in at least on embodiment, the one-shot circuit includes a mono-stable multi-vibrator pulse generator. The one-shot circuit 350 may initiate a pulse on the reset node 314 in response to a transition on the flash null input 304. The pulse on the reset node 314 may cause the "go to null pull-up network" 320 to drive the logical evaluation node 312 high, and cause the DC blocking circuit 330 to block current from flowing. The output line 322 transitions to a zero state in response to the logical evaluation node 312 going high.

A pulse termination circuit 360 connected to the one-shot circuit 350 may be included in some embodiments. The pulse termination circuit 360 output 364 may end the pulse generated by the one-shot 350. In some embodiments, the pulse termination circuit 360 has the output line 322, of the gate, as an input to the pulse termination circuit 360. In some embodiments, the pulse termination circuit 360 has, as an input, a node within the gate derived from a logical evaluation node 312. The one-shot pulse termination circuit 360 may include logic to determine that the output 322 has been reset to null which may then be used to terminate the pulse generated by the one-shot 350. In some embodiments, the one-shot pulse termination circuit 360 may simply be a wire from one of the inputs of the one-shot pulse termination circuit 360 to its output.

Figure 4:
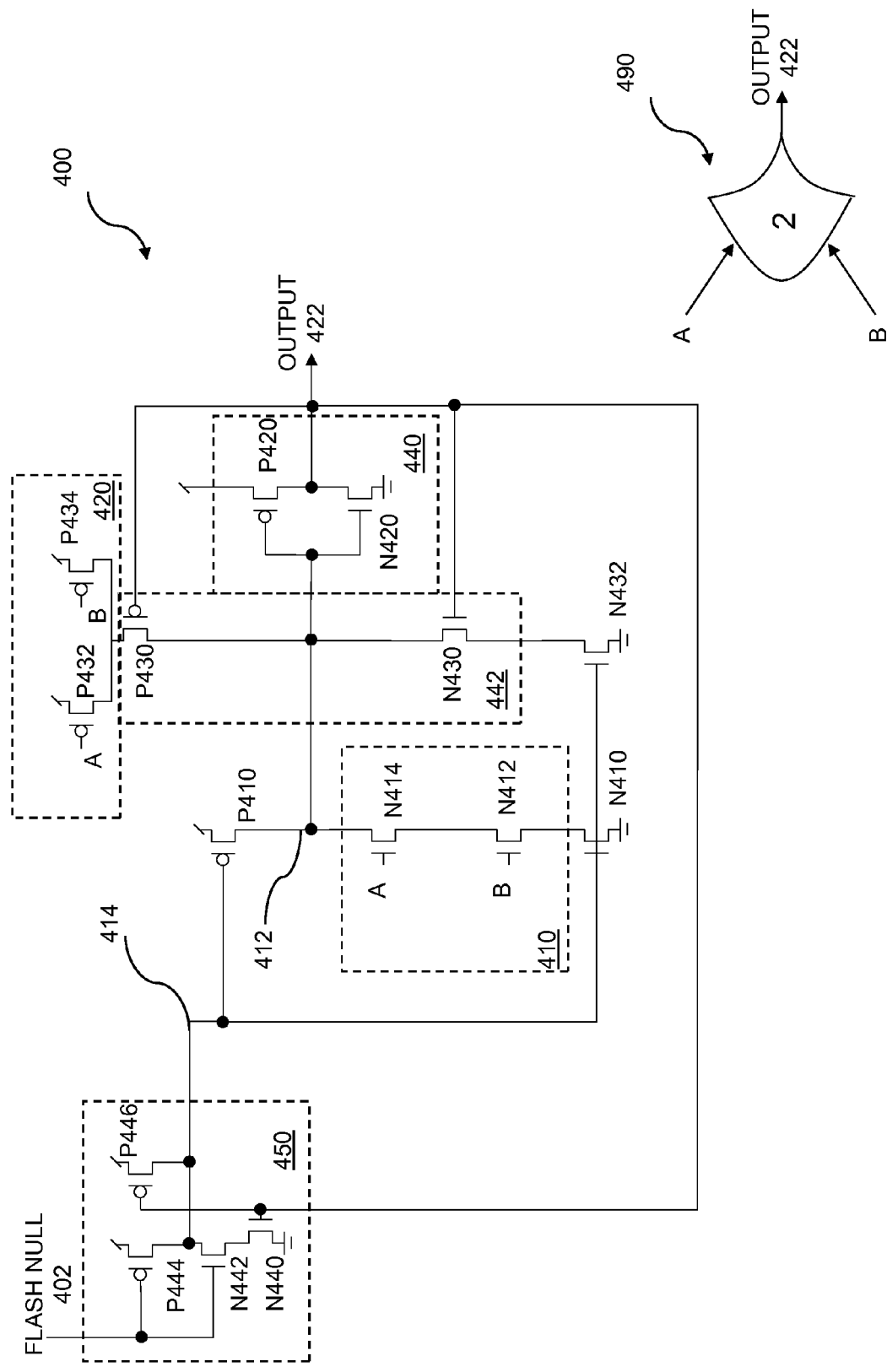
FIG. 4 is an example 2-of-2 self-ready flash NCL circuit.

FIG. 4 is an example 2-of-2 self-ready flash NCL circuit 400. An alternative schematic representation of the gate 400 is the gate symbol 490 having two inputs, "A", and "B", with the numeral "2" inside the gate symbol, and a single output 422. The circuit 400 is very similar to the gate 100 of FIG. 1. In circuit 400, the logical evaluation is performed by the 2-of-2 pull-down network 410 that includes NFET N414 and NFET N412 in series, with input A driving the gate of NFET N414 and input B driving the gate of NFET 412. The circuit 400 includes a flash null input line 402 coupled to a one-shot circuit 450 that may be used to reset the circuit 400 and set the output line 422 into the null output state. In the circuit 400, the one-shot 450 initiates a low voltage level pulse on the reset node 414 in response to the flash input line 402 transitioning from low to high while the output line 422 is asserted. The one-shot 450 in the example circuit 400 is a NAND gate including NFET N440 and PFET P446 driven by the output line 422, and NFET N442 and PFET P444 driven by the flash null input line 402. The two NFETs N442, N440 are arranged in series and the two PFETs P444, P446 are in parallel, so that the reset node 414 is pulled low if both the flash null input line 402 and the output line 422 are high, but the reset node 414 is pulled high if either the flash input line 402 or the output line 422 are low.

A low voltage level on the reset node 414 turns on PFET P410 and turns off NFET N410, which pulls logical evaluation node 412 high. Logical evaluation node 412 is fed into the output inverter 440 which is built from PFET P420 and NFET N420, so the output line 422 goes low, or to null. A high level on the reset node 414 turns PFET P410 off and NFET N410 on, allowing the 2-of-2 pull-down network 410 built with NFET 412 and NFET 414 to perform its logical evaluation function. As long as at least one of input A and input B is null, the network 410 is in a high-impedance state so that logical evaluation node 412 remains high and the output line 422 is low, or null. Because NFET N410 is on, once both input A and input B are asserted, logical evaluation node 412 is pulled low, causing output inverter 440 to assert, or drive high, the output line 422. So the circuit 400 is an m-of-n flash type threshold gate (where m=2 and n=2) including a plurality of transistors that provide for logical evaluation. The circuit 400 also includes a plurality of n input lines (i.e. A, B, . . . N), each with an asserted state and a null state, connected to the gate, a flash input line 402, having a first state and a second state, connected to the gate, and an output line 422, with an asserted output state and a null output state, connected to the gate. The output line 422 transitions to the asserted output state when m of the n input lines (i.e. A, B, . . . N) are in their respective asserted states.

An inverter 442 built from PFET P430 and NFET N430 acts as storage to provide feedback from the output 422 to logical evaluation node 412. The inverter 442 is a gated inverter which is part of the storage element for the gate 400. The power to the inverter 442 is gated by circuit 420 that includes PFET P432 driven by input A and PFET P434 driven by input B, so the gated inverter is gated in part based on the plurality of input lines. The circuit 420 provides power to the inverter 442 if either input A is low or input B is low thus allowing the inverter 442 to provide charge through PFET 430 to the logical evaluation node 412 if gate 400 is reset until both inputs are asserted. Once both inputs are asserted, the circuit 410 cuts off power to the inverter 442 and the logical evaluation circuit 410 pulls the logical evaluation node 412 low, causing the output line 422 to go high, which may also turn off PFET P430.

The ground to the inverter 442 is gated by NFET N432 which is driven by the reset node 414. The reset node 414 is the output of the one-shot circuit 450 which is triggered by the flash null line 402, which may also be called the flash input line. So the gated inverter is gated in part based on the flash input line, because the reset node 414 is based on the flash null input 402. NFET N432 is turned on if the reset node 414 is high, indicating that the gate 400 is not in the process of being reset and is able to evaluate the inputs. So once the output line 422 is asserted, turning on NFET 430, the logical evaluation line 412 may be held low through NFET N430 and NFET N432 until the reset node 414 is driven low, turning off NFET N410 and NFET 432, disconnecting the inverter 442 from ground, and turning on PFET P410 to drive the logical evaluation node 412 high.

Figure 5:
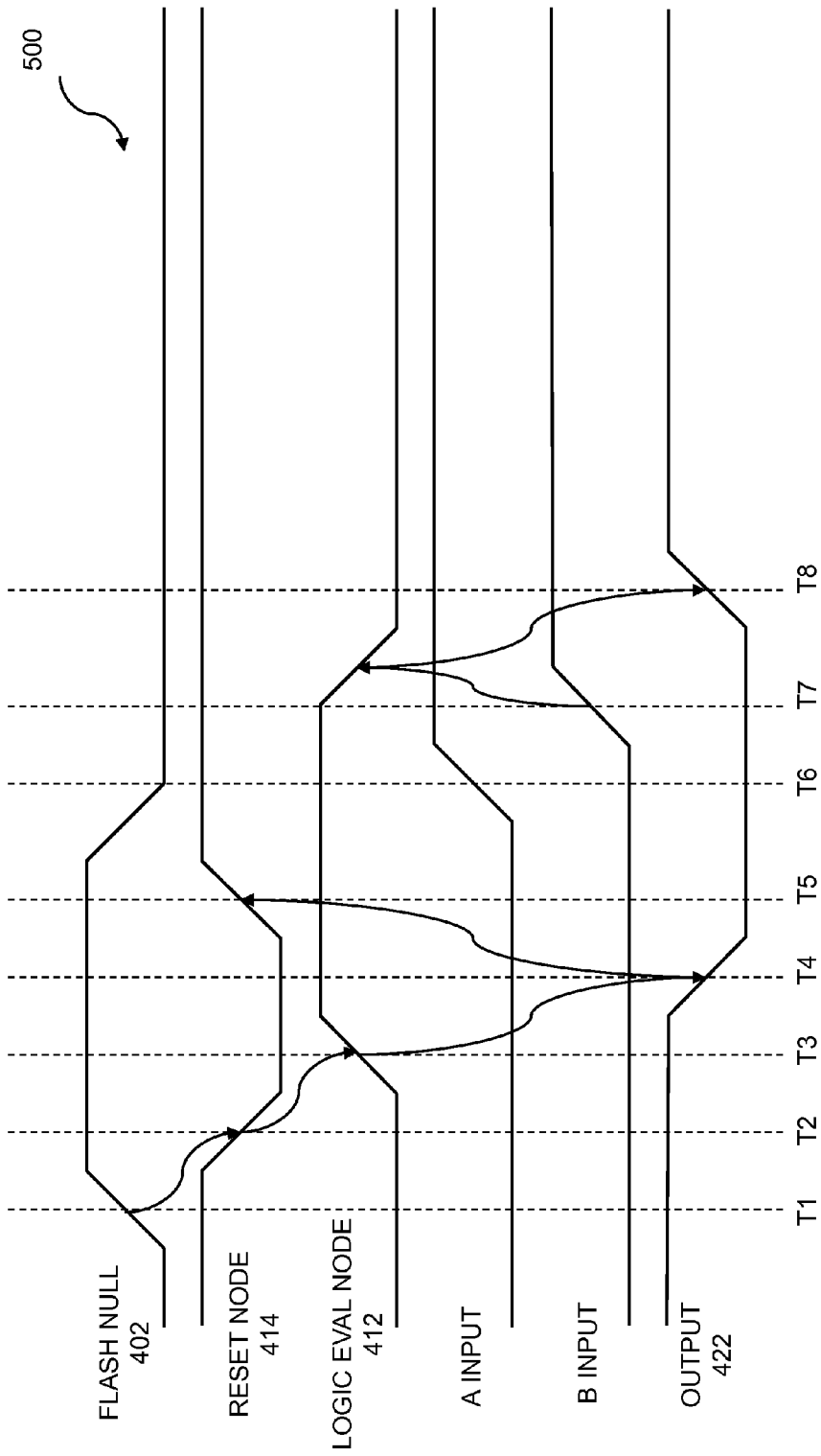
FIG. 5 is an example waveform diagram for a self-ready flash NCL circuit.

FIG. 5 is an example waveform diagram 500 for a self-ready flash NCL circuit 400. The circuit 400 of FIG. 4 has its output line 422 asserted at time T1 as the flash null line 402 is driven high. The transition of the flash null line 402 from low to high causes the one-shot circuit 450 to drive the reset node 414 low at time T2. The low reset node 414 turns on PFET P410 and turns off NFET N410 and NFET N432 so that the logical evaluation node 412 is pulled high at time T3. The logical evaluation node 412 is inverted by the output inverter 440 so the output line 422 goes null at time T4. The low output line 422 is fed to the one-shot 450 to terminate the pulse so that the reset node 414 goes high at time T5. The self-ready flash NCL circuit 400 is reset at time T5.

The flash null input 402 returns to low before time T6 to allow the circuit to begin to evaluate its inputs. Input A goes high at time T6 and input B goes high at time T7, causing the 2-of-2 pull-down network 410 to pull down the logical evaluation node 412 which causes the output line 422 to be asserted at time T8. So the plurality of transistors that provide for logical evaluation pulls down a node within the gate and cause the output line 422 to transition to the asserted output state.

The time delays between times T1, T2, T3, T4 and T5 are dependent on the speed of the various transistors of the circuit 400 as well as the capacitance and resistance of the various circuit elements. The timing of times T6 and T7 are determined outside of the circuit 400 by the circuits driving input A and input B. The time delay between times T7 and T8 is again dependent on the speed of the various transistors of the circuit 400 as well as the capacitance and resistance of the various circuit elements.

Figure 6:
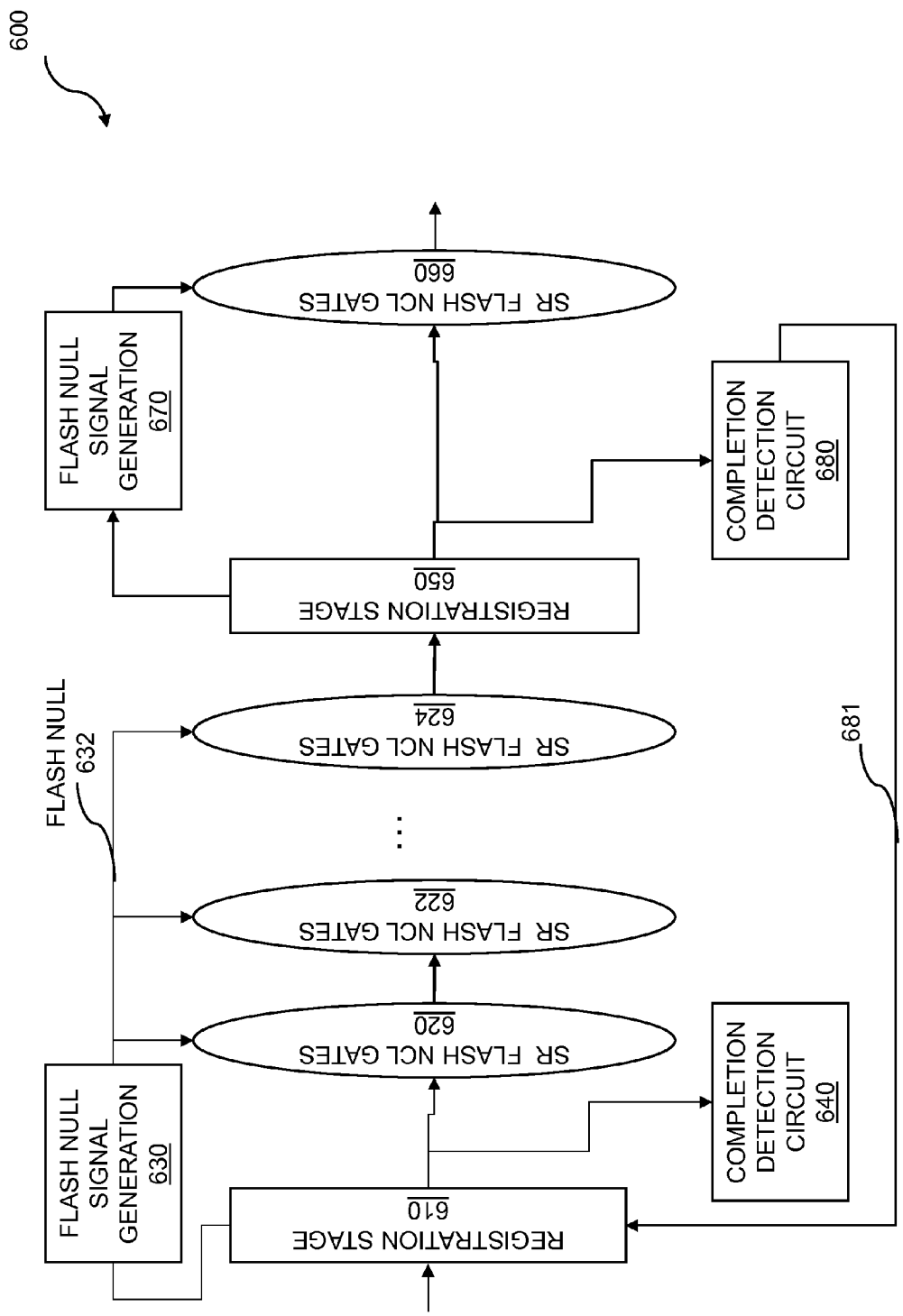
FIG. 6 is a block diagram of self-ready flash NCL gate usage.

FIG. 6 is a block diagram 600 of self-ready flash NCL gate 300 usage. A NCL circuit pipeline may be constructed similar to pipelines used in conventional NCL circuits except that a flash null line 632 may be provided to the combinatorial NCL logic. In some embodiments, self-ready NCL logic may be mixed with conventional NCL logic and/or flash NCL logic, so the output line of the self-ready NCL logic gate drives an input of one of an NCL gate, a Flash NCL gate, and a Self-Ready Flash NCL gate. In other embodiments self-ready NCL logic may be mixed with more conventional combinatorial logic and/or synchronous logic blocks. The registration stage 610 may latch incoming lines from a previous stage of the pipeline. The registration stage 610 may use asynchronous latches to detect and save the inputs that have been asserted. A completion detection circuit 640 may detect that all inputs of the registration stage 610 have been received and may communicate with a previous stage of the pipeline (not shown). The inputs to the registration stage 610 asynchronously flow though the registration stage 610 and through the cascaded SR flash NCL gates 620, 622, 624, propagating assertions to the next registration stage 650. The outputs of the next registration stage 650 may then flow to further self-ready flash NCL gates 660. It should be noted that a one-shot circuit for the SR flash NCL gates may be shared among multiple gates in certain embodiments.

The inputs to the next registration stage 650 may be organized into mutually exclusive assertion groups where only one of the lines of an assertion group may be asserted at a time, as in the case of dual rail NCL. By monitoring the assertion groups, the completion detection circuit 680 may determine that each of the assertion groups asserts data (which means all the dual rail pairs that are inputs to the completion detection circuit have left the null state), indicating that the computation of the previous stage of SR flash NCL gates 620, 622, 624 has completed. Once the detection circuit 680 has detected that each assertion group has data asserted, the completion detection circuit 680 may indicate that all inputs have been received at the next registration stage 650 and fed back to the previous registration stage 610 by triggering completion line 681. In response to the triggering of the completion line 681, the registration stage 610 may clear its latches and communicate with flash null signal generation 630 to generate a flash null 632 signal. The flash null 632 may couple to the flash null inputs of the various SR flash NCL gates 620, 622, 624, to reset the NCL gates. The next registration stage 650 may receive an input from the following registration stage (not shown) and may use a flash null signal generation 670 circuit to generate a flash null signal for its downstream SR flash NCL gates 660.

Figure 7:
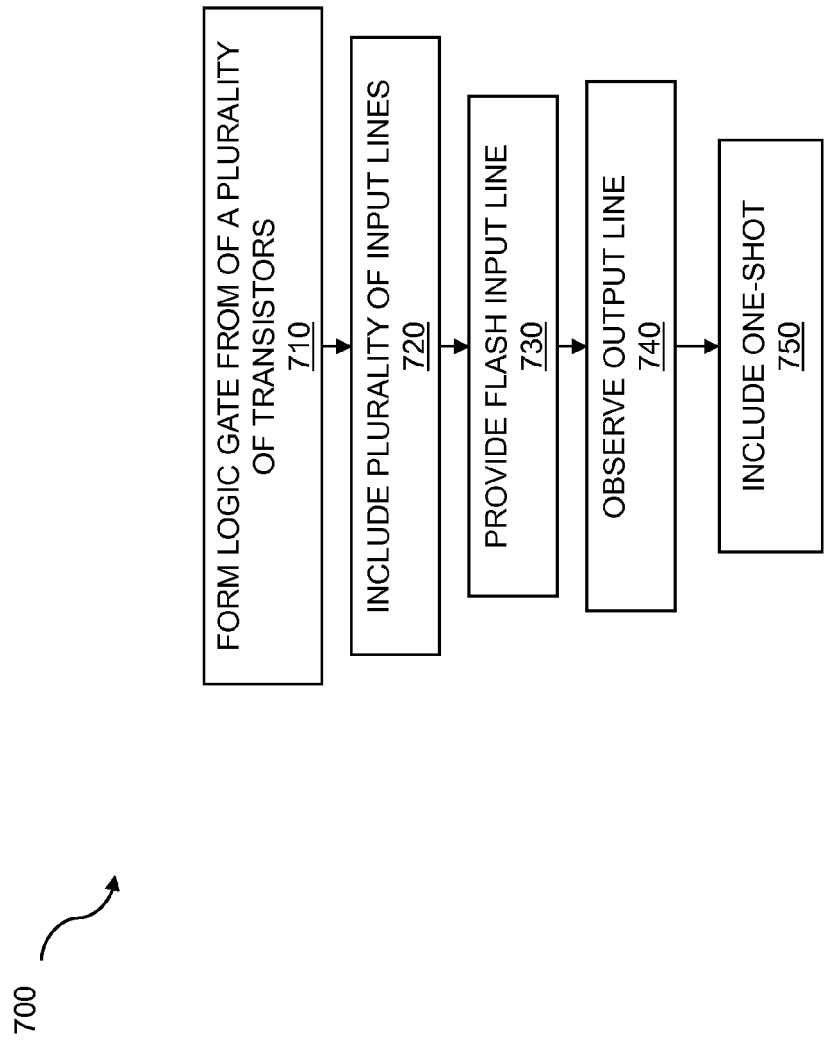
FIG. 7 is flow diagram for implementing design with self-ready flash NCL gates.

FIG. 7 is flow diagram 700 for implementing design with self-ready flash NCL gates. The flow 700 for a computer implemented method for using logical evaluation begins by forming a logic gate from a plurality of transistors 710 and including a plurality of input lines 720 each with an asserted state and a null state, connected to the gate. The logic gate may be similar to those shown in FIGS. 1-4. The plurality of transistors provide for logic evaluation, such as performing m-of-n threshold detection of the plurality of input lines, or any other logical evaluation. The flow 700 continues with providing a flash input line 730, having a first state and a second state, connected to the gate. The flow 700 continues with observing an output line 740, with an asserted output state and a null output state, connected to the gate. The output line may be observed by other gates on the same integrated circuit or different integrated circuits, or with various test equipment such as, but not limited to, an oscilloscope, wafer test equipment, in-circuit testers, or other test equipment. The flow 700 concludes by including a one-shot circuit 750 wherein the flash input line is an input to the one-shot circuit. The one-shot circuit is used to reset the gate and set the output line into the null output state.

Figure 8:
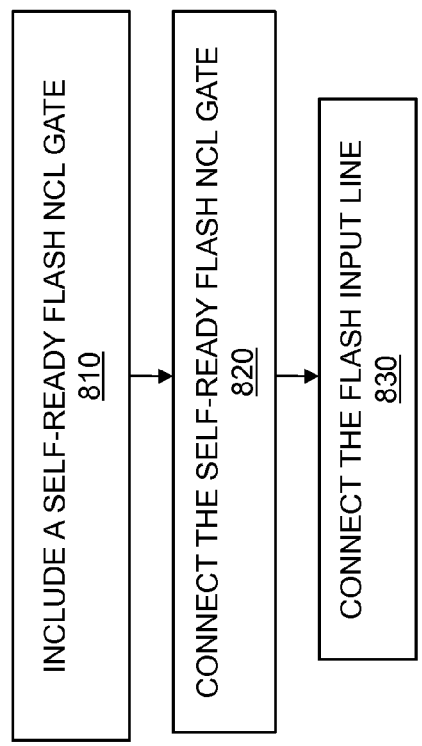
FIG. 8 is a flow diagram of a method for using self-ready flash NCL.

FIG. 8 is a flow diagram of a method for using self-ready NCL. The flow 800 comprises including a self-ready flash null convention logic gate 810. This flow may be implemented as part of an electronic design automation system. The self-ready flash NCL logic may be implemented along with other logic types. The self-ready flash NCL may be interspersed with other logic to accomplish the desired logic function. A mix of asynchronous and synchronous logic may be used. The self-ready flash null convention logic gate may comprise: a plurality of transistors wherein the plurality of transistors provide for logical evaluation; a plurality of input lines, each with an asserted state and a null state, connected to the logic gate; a flash input line, having a first state and a second state, connected to the logic gate; an output line, with an asserted output state and a null output state, connected to the logic gate; and a one-shot circuit wherein the flash input line is an input to the one-shot circuit and wherein the one-shot circuit is used to reset the logic gate and set the output line into the null output state. The flow 800 continues with connecting the self-ready flash null convention logic gate 820 to preceding and following logic. The flow 800 continues with connecting the flash input line 830 to a flash null generation circuit. Various steps in the flow 800 may be changed in order, repeated, omitted, or the like without departing from the disclosed inventive concepts. Various embodiments of the flow 800 may be included in a computer program product embodied in a non-transitory computer readable medium that includes code executable by one or more processors.

Figure 9:
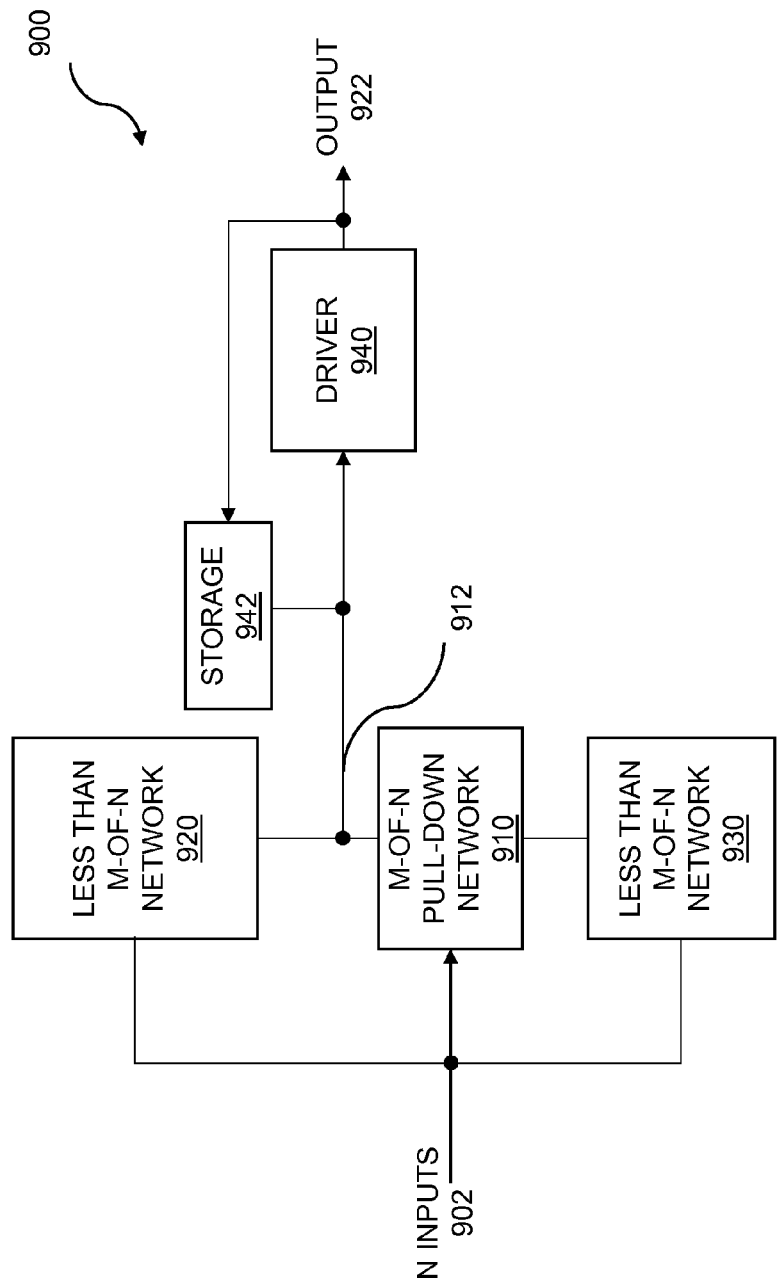
FIG. 9 is a block diagram for an M-of-N logic gate with near-ready activation.

FIG. 9 is a block diagram for an m-of-n logic gate with near-ready activation. A near-ready NCL activation gate can be powered up with a condition near an m-of-n input assertion condition is reached. By activating only when the inputs are near an m-of-n condition, power can be reduced most of the time and then high speed transition can be achieved when the actual m-of-n asserted condition is reached. The block diagram of FIG. 9 presents a conceptual view of an example near-ready activation NCL gate. The circuit 900 may have "n" inputs 902 coupled to an m-of-n pull-down network 910. The m-of-n pull-down network 910 may be coupled between a "less than m-of-n" pull-up network 920 and a "less than m-of-n" pull-down network 930, or can use either a single pull-up network 920 or pull-down network 930. Logical evaluation node 912, may be located between the "m-of-n pull-down network" 910 and the "less than m-of-n" pull-up network 920, and is also coupled to a driver 940 that may drive the output line 922. Storage 942 may feed-back the state of the output line 922 to the logical evaluation node 912 to provide stability and/or hysteresis in some embodiments.

The "less than m-of-n" pull-down network 930 may simply be an NFET device that limits current in the overall pull-down network where the gate of the NFET is controlled. In some embodiments, the NFET device can be a high-threshold voltage NFET device. The control on the "less than m-of-n" pull-down network 930 enables activation of the pull-down network 930 based on some value on the "n" inputs 902. In a typical NCL logic gate, when m-of-n inputs are active, then the logic evaluation node 912 transitions. With the "less than m-of-n" pull-down network 930, the pull-down network 930 activates when a near to m-of-n situation is encountered. For example the "less than m-of-n" pull-down network 930 may be set to activate when m-minus-one of the n inputs are active. By this technique, power can be reduced through the "m-of-n pull-down network" 910 because the lower portion, i.e. the "less than m-of-n" pull-down network 930 is not active and is shut off. Then when a near-ready condition of m-minus-one of the n inputs is asserted, then the "less than m-of-n" pull-down network 930 becomes active allowing for a quick transition on logic evaluation node 912 when the last of the n inputs needed to cause the "m-of-n pull-down network" 910 to become active. The "less than m-of-n" pull-down network 930 capability may be considered a wakeup circuit which becomes active when a near-ready state occurs on surrounding logic.

Likewise, the "less than m-of-n" pull-up network 920 may simply be a PFET device that limits current through the evaluation node where the gate of the PFET is controlled. In some embodiments, the PFET device can be a high-threshold voltage PFET device. The control on the "less than m-of-n" pull-up network 920 can enable shutting off of reset for a flash NCL logic gate. In some embodiments, the "less than m-of-n" pull-up network 920 can be attached to an m-of-n pull-up network where a NCL logic gate includes pull-up capability on the logic evaluation node. The configurations for the "m-of-n pull-down network" 910, the "less than m-of-n" pull-up network 920, and the "less than m-of-n" pull-down network 930 are shown for illustration and should not be viewed by way of limitation. Numerous other configurations are possible for NCL-type logic gates where a near-ready or wakeup-type circuit could be envisioned. Control for near-ready conditions could easily be broader than a single NCL logic gate. A wakeup condition could be detected and propagated to downstream logic enabling the downstream logic to power up and become ready for NCL inputs to be asserted. It should also be understood that a near-ready condition could be encountered but that actual evaluation might not subsequently occur. In that situation, after a certain period of time the near-ready condition could be deactivated and a low power condition resumed. In some embodiments, once a non-near-ready condition was reached on inputs to one or more of these near-ready NCL logic gates the near-ready NCL logic gates could be deactivated to reduce power.

Figure 10:
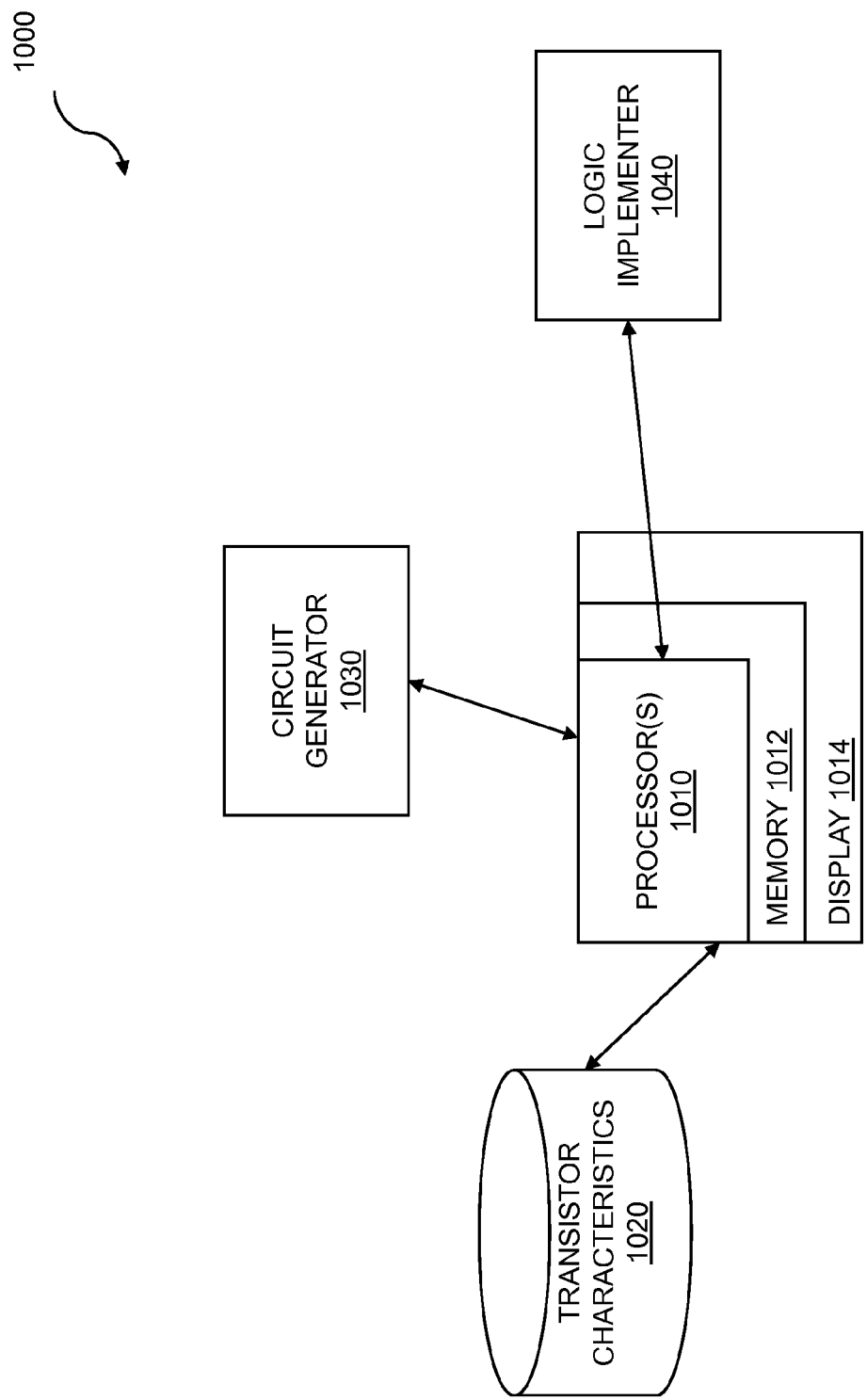
FIG. 10 is a diagram of a system for implementing self-ready flash NCL.

FIG. 10 is a diagram of a system 1000 for implementing self-ready NCL. The system 1000 includes one or more processors 1010 and a memory 1012 which stores instructions. The memory 1012 is coupled to the one or more processors 1010 wherein the one or more processors 1010 can execute instructions stored in the memory 1012. The memory 1012 may be used for storing instructions, for storing circuit designs, for storing logic designs, for system support, and the like. The one or more processors 1010 may read in transistor characteristics 1020 for a given technology. The transistor characteristics 1020 may include information on standard and high-Vt FETs.

The one or more processors 1010 may use the transistor characteristics 1020 to implement self-ready flash NCL or near-ready activation NCL circuitry using a circuit generator 1030. The circuit generator 1030 may provide a design for a one-shot circuit which is included in the self-ready flash NCL logic gate. The one or more processors may include a self-ready flash null convention logic gate to implement various logic designs using a logic implementer 1040. The logic implementer 1040 may connect self-ready flash null convention logic gate to preceding and following logic. The logic implementer 1040 may use VHDL™, Verilog™, or other hardware description language (HDL) as input which is used to define the desired logic. Further, the logic implementer 1040 may connect the flash input line to a flash null generation circuit. Information about the various designs may be shown on a display 1014 which is attached to the one or more processors 1010. The display 1014 may be any electronic display, including but not limited to, a computer display, a laptop screen, a net-book screen, a tablet screen, a cell phone display, a mobile device display, a remote with a display, a television, a projector, or the like. In some embodiments, the system 1000 may be embodied in a client computer, a server, a cloud server, or a combination thereof. In at least one embodiment, a single computer may incorporate the components described above. The system 1000 may include computer program product embodied in a non-transitory computer readable medium for logic implementation. The system 1000 may include computer program product embodied in a non-transitory computer readable medium for logic implementation comprising: code for including a self-ready flash null convention logic gate wherein the self-ready flash null convention logic gate comprises: a plurality of transistors wherein the plurality of transistors provide for logical evaluation; a plurality of input lines, each with an asserted state and a null state, connected to the logic gate; a flash input line, having a first state and a second state, connected to the logic gate; an output line, with an asserted output state and a null output state, connected to the logic gate; and a one-shot circuit wherein the flash input line is an input to the one-shot circuit and wherein the one-shot circuit is used to reset the logic gate and set the output line into the null output state; code for connecting the self-ready flash null convention logic gate to preceding and following logic; and code for connecting the flash input line to a flash null generation circuit.

Each of the above methods may be executed on one or more processors on one or more computer systems. Embodiments may include various forms of distributed computing, client/server computing, and cloud based computing. Further, it will be understood that for each flowchart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which implementations may be generally referred to herein as a "circuit," "module," or "system."

A programmable apparatus that executes any of the above mentioned computer program products or computer implemented methods may include one or more processors, microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM), Flash, MRAM, FeRAM, phase change memory, an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become apparent to those skilled in the art. Accordingly, the spirit and scope of the present invention is not to be limited by the foregoing examples, but is to be understood in the broadest sense allowable by law.

What is claimed is:

1. A logic circuit comprising:
    a gate comprised of a plurality of transistors wherein the plurality of transistors provide for logical evaluation;
    a plurality of input lines, each having an asserted state and a null state, connected to the gate;
    a flash input line, having a first state and a second state, connected to the gate;
    an output line, having an asserted output state and a null output state, connected to the gate; and
    a one-shot circuit wherein the flash input line is an input to the one-shot circuit and wherein the one-shot circuit is used to reset the gate and set the output line into the null output state.

2. The logic circuit of claim 1 wherein the plurality of transistors that provide for logical evaluation pull down a node within the gate and cause the output line to transition to the asserted output state.

3. The logic circuit of claim 1 further comprising a storage element that retains one of the asserted output state and the null output state on the output line.

4. The logic circuit of claim 1 further comprising a pulse termination circuit connected to the one-shot circuit.

5. The logic circuit of claim 4 wherein the pulse termination circuit has the output line, of the gate, as an input to the pulse termination circuit.

6. The logic circuit of claim 4 wherein the pulse termination circuit has, as an input, a node within the gate derived from a logical evaluation node.

7. The logic circuit of claim 1 wherein the gate comprises an m-of-n threshold gate.

8. The logic circuit of claim 7 wherein the gate forms a null convention circuit.

9. The logic circuit of claim 1 further comprising a transistor in a pull-up path coupled to a path for the logical evaluation.

10. The logic circuit of claim 9 wherein the transistor in the pull-up path is part of circuitry used to reset the gate.

11. The logic circuit of claim 9 wherein the transistor in the pull-up path is a high-threshold transistor.

12. The logic circuit of claim 9 wherein the transistor in the pull-up path limits current leakage for the gate when the transistor in the pull-up path is in an off state.

13. The logic circuit of claim 9 wherein the transistor in the pull-up path is activated based on a subset of signals that are coupled to the plurality of transistors that provide for logical evaluation and the subset of signals activate the transistor in the pull-up path without enabling the logical evaluation.

14. The logic circuit of claim 1 further comprising a transistor in a pull-down path coupled to a path for the logical evaluation.

15. The logic circuit of claim 14 wherein the transistor in the pull-down path is a high-threshold transistor.

16. The logic circuit of claim 14 wherein the transistor in the pull-down path turns off the pull-down path when the gate is being reset.

17. The logic circuit of claim 14 wherein the transistor in the pull-down path limits current leakage for the gate when the transistor in the pull-down path is in an off state.

18. The logic circuit of claim 14 wherein the transistor in the pull-down path is activated based on a subset of signals that are coupled to the plurality of transistors that provide for logical evaluation and the subset of signals activate the transistor in the pull-down path without enabling the logical evaluation.

19. A computer implemented method for using logic implementation comprising:
   including a self-ready flash null convention logic gate wherein the self-ready flash null convention logic gate comprises:
      a plurality of transistors wherein the plurality of transistors provide for logical evaluation;
      a plurality of input lines, each having an asserted state and a null state, connected to the logic gate;
      a flash input line, having a first state and a second state, connected to the logic gate;
      an output line, having an asserted output state and a null output state, connected to the logic gate; and
      a one-shot circuit wherein the flash input line is an input to the one-shot circuit and wherein the one-shot circuit is used to reset the logic gate and set the output line into the null output state;
   connecting the self-ready flash null convention logic gate to preceding and following logic; and
   connecting the flash input line to a flash null generation circuit.

20. A computer program product embodied in a non-transitory computer readable medium for logic implementation comprising:
   code for including a self-ready flash null convention logic gate wherein the self-ready flash null convention logic gate comprises:
      a plurality of transistors wherein the plurality of transistors provide for logical evaluation;
      a plurality of input lines, each having an asserted state and a null state, connected to the logic gate;
      a flash input line, having a first state and a second state, connected to the logic gate;
      an output line, having an asserted output state and a null output state, connected to the logic gate; and
      a one-shot circuit wherein the flash input line is an input to the one-shot circuit and wherein the one-shot circuit is used to reset the logic gate and set the output line into the null output state;
   code for connecting the self-ready flash null convention logic gate to preceding and following logic; and
   code for connecting the flash input line to a flash null generation circuit.

* * * * *